United States Patent [19]

Gaus

[11] 4,284,168

[45] Aug. 18, 1981

[54] LOUDSPEAKER ENCLOSURE

[75] Inventor: Harry Gaus, Kronberg, Fed. Rep. of Germany

[73] Assignee: Braun Aktiengesellschaft, Frankfurt, Fed. Rep. of Germany

[21] Appl. No.: 936,105

[22] Filed: Aug. 23, 1978

[30] Foreign Application Priority Data

Aug. 25, 1977 [DE] Fed. Rep. of Germany ....... 2738295

[51] Int. Cl.³ .......................... H05K 5/00; E04B 1/82

[52] U.S. Cl. .................................... 181/199; 181/145; 181/146; 181/290

[58] Field of Search ............... 181/145, 146, 148, 156, 181/149, 151, 198, 199, 290, 294, 155, 163, 204, 207, 208; 179/1 E; 428/116; 312/7 R, 7 TV, 111; 220/4 E, 4 F, 4 R, 80; D14/30, 33

[56] References Cited

U.S. PATENT DOCUMENTS

| | | | |
|---|---|---|---|
| 929,865 | 8/1909 | Mahong | 220/4 E |
| 2,037,151 | 4/1936 | Safford | 220/4 E |
| 3,045,857 | 7/1962 | Lineweber | 220/80 |
| 3,424,270 | 1/1969 | Hartman et al. | 181/294 |
| 3,620,403 | 11/1971 | Rump | 220/4 E |
| 3,640,833 | 2/1972 | Oberst et al. | 181/290 |
| 3,706,393 | 12/1972 | Curtis et al. | 220/4 R |
| 3,710,761 | 1/1973 | Gregory | 220/4 E |
| 3,804,195 | 4/1974 | Everitt et al. | 181/148 |
| 3,848,696 | 11/1974 | Everitt | 181/156 |
| 3,948,614 | 4/1976 | Michalow | 428/116 |
| 4,064,966 | 12/1977 | Burton | 181/155 |
| 4,146,111 | 3/1979 | Mwe et al. | 181/163 |

FOREIGN PATENT DOCUMENTS

| | | |
|---|---|---|
| 1821346 | 8/1960 | Fed. Rep. of Germany . |
| 1512746 | 7/1971 | Fed. Rep. of Germany . |
| 7600131 | 1/1976 | Fed. Rep. of Germany . |
| 2304711 | 8/1976 | Fed. Rep. of Germany . |

OTHER PUBLICATIONS

Klinger, "Lautsprecher und Lautsprecherge haüse fur HiFi", 7, Auglage, 1975, 5, 74.

*Primary Examiner*—L. T. Hix
*Assistant Examiner*—Benjamin R. Miller
*Attorney, Agent, or Firm*—Fishman and Van Kirk

[57] ABSTRACT

A loudspeaker enclosure for use in housing loudspeakers, the loudspeaker enclosure comprising a casement having a generally rectangular cuboid shape, the casement including three layers. A first layer and a second layer comprise sheets of metal and are space apart to provide for an inner layer of plastic material. In one embodiment of the invention, the casement is formed by bending a sheet of material including the three aforementioned layers to conform to a generally rectangular cuboid shape. In another embodiment of the invention, the first layer of metal is bent to a rectangular cuboid shape defining four interior surfaces. A flat layer of plastic and a flat layer of metal is applied to each interior surface of the casement. The casement provides a wall having a relatively high density, a high modulus of elasticity and a high damping factor.

22 Claims, 8 Drawing Figures

FIG. 6
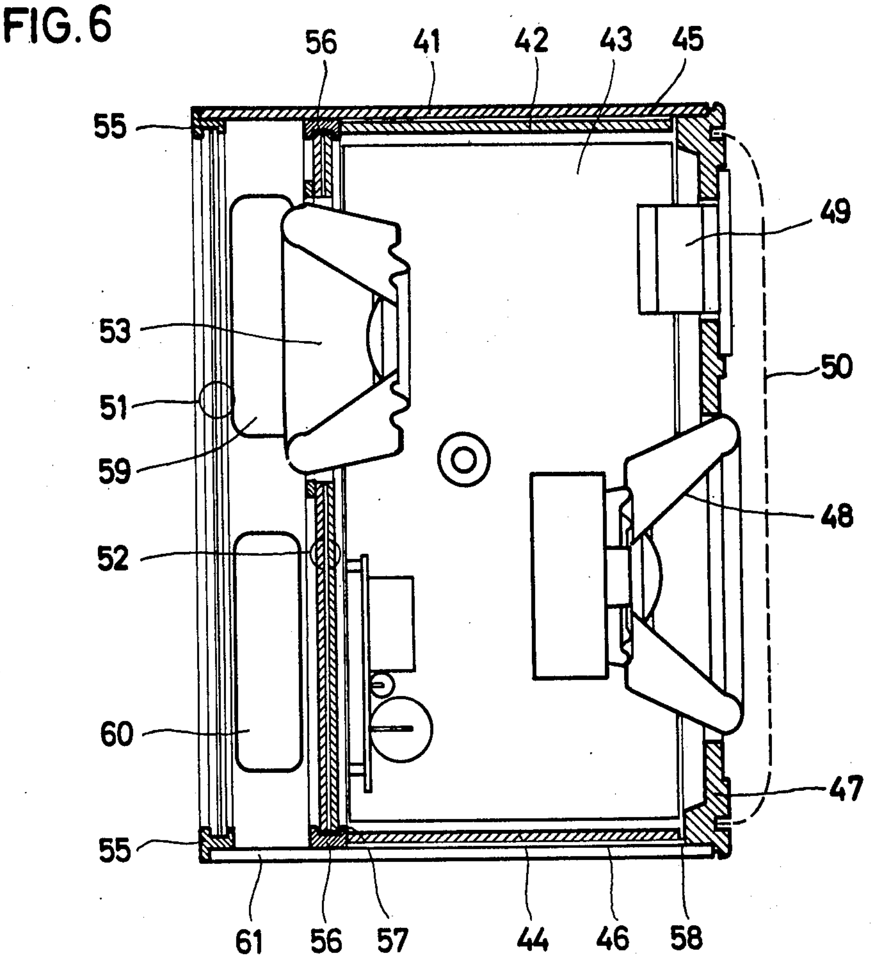
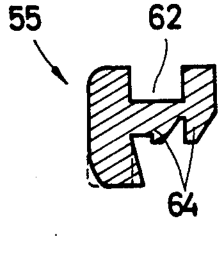
FIG. 7
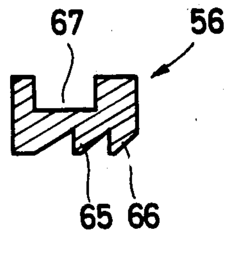
FIG. 8

LOUDSPEAKER ENCLOSURE

BACKGROUND OF THE INVENTION (1) Field of the Invention

The invention relates to a loudspeaker enclosure.

(2) Description of the Prior Art

The primary purpose of a loudspeaker enclosure is to prevent an acoustical short circuit. This acoustical short circuit can occur, for instance, when the air in front of the loudspeaker membrane is compressed while the air behind the loudspeaker membrane expands during forward motion of the speaker. Thus, the acoustical oscillations from the front of the membrane are in a phase which is in opposition to the phase of the acoustic oscillations from the rear of the membrane. If the acoustical oscillations from the rear of the membrane interfere with the acoustical oscillations from the front of the membrane, then the oscillations may tend to cancel each other and no sound is produced. However, the effect of the acoustical short circuit is only noticeable at low frequencies. The effect of the acoustical short circuit is negligible at high frequencies at which the sound is practically unidirectional.

By placing the loudspeakers in an enclosure, acoustic oscillations from the front of the loudspeaker membrane are prevented from traveling to the rear of the loudspeaker membrane. Acoustical short circuiting is thus reduced or avoided.

However, the use of loudspeaker enclosures creates other undesirable effects. One of these is the natural resonance frequency of the enclosure. To a great extent, this resonance is determined by the size of the enclosure and the material from which the enclosure is made. The elimination of the enclosure resonance is essential in obtaining a sound reproduction free of distortion. In order to eliminate the resonance, the enclosure should be constructed of a material with high intrinsic damping. The enclosure must also possess a certain density.

The sound radiation produced by resonance of the enclosure walls is determined by different factors: If the frequency is low, sound radiation depends upon the flexural strength of the enclosure walls. If the frequency is high, the sound radiation depends upon the material which covers the enclosure walls. If the frequency is in the area of the various modes of resonance of the enclosure, then the sound radiation depends upon the damping of the enclosure walls.

In order to meet the conditions listed above, it has been suggested that speaker enclosures be made of spruce, fir or birch wood, with double walls separated by a hollow space. The hollow space would then be filled with fine dry sand or with rigid expanded polyurethane (Klinger, Lautsprecher und Lautsprechergehäuse für HiFi, 7. Auflage, 1975, S. 74). The construction of loudspeaker enclosures of wood is, however, relatively expensive since the walls have to be relatively thick and since the exterior of the enclosure must be finished.

One loudspeaker enclosure presently manufactured uses at least two layers of corrugated cardboard with the grooves placed vertically (German Patent Application No. 23 04 711). The surface treatment of these loudspeakers is inherently quite difficult. The same is true for the loudspeaker enclosure disclosed in U.S. Pat. No. 3,848,696 wherein one supporting layer is connected with at least two corrugated layers of foil.

In another loudspeaker cabinet, the enclosure is either partially or completely made out of polystyrene (German Utility Model No. 18 21 346). In order to diminish the resonance, the enclosure walls are rounded. Furthermore, the entire enclosure is covered with washable plastic. The disadvantage of this loudspeaker cabinet is that the enclosures resonates.

In order to avoid the drawbacks of plastic enclosures, a loudspeaker cabinet has been proposed which is completely filled with plastic foam. It would conform to the shape of the loudspeaker(s) in the rear and the exterior sides could be covered with an impact-resisting material (German Patent Application No. 15 12 746; see also German Utility Model No. 76 00 131). However, the application of the impact resisting material to the plastic foam would involve complicated processes.

Constructing enclosures as hollow frame shells so that plastic foam can be blown into the shells has the disadvantage that the resonance of the enclosure would still be too high.

One object of the present invention is to provide a loudspeaker enclosure having relatively thin walls and which may be easily manufactured.

It is another object of the present invention to provide a loudspeaker enclosure in which enclosure wall resonance is effectively damped so that only minor sound radiation eminates from the loudspeaker enclosure.

It is another object of the present invention to provide a loudspeaker enclosure that is particularly well suited for relatively small loudspeakers.

It is another object of the present invention to allow for relatively simple fabrication of the loudspeaker enclosure and to allow for simple installation of the front and rear panels of a loudspeaker enclosure.

SUMMARY OF THE INVENTION

The present invention provides a loudspeaker enclosure in which the casement for the enclosure comprises three layers. A first layer and a second layer, both comprising sheets of metal, are spaced apart to provide for an inner layer of plastic material. The casement comprising the three layers of material provides a wall having a relatively high density, a high modulus of elasticity and high damping factor. These properties reduce the flexural oscilations of the walls which, in turn, reduces sound radiation from the walls. The walls of the enclosure can be made relatively thin. For small loudspeakers, it is desirable to provide relatively thin walls to obtain a favorable ratio between the net volume and the gross volume.

In one embodiment of the invention, the casement is formed from sheet material having the aforementioned two metal layers disposed on either side of a plastic layer. The sheet of material is bent to conform to a generally rectangular shape. A front panel which is designed to hold the loudspeakers and a rear panel may be fit onto the enclosure to provide a complete loudspeaker enclosure. In the process of bending the three layers, consideration should be given to the possible displacements of the three layers.

In another embodiment of the invention, the casement is constructed of a layer of metal, preferably steel, which is bent into a rectangular cuboid shape, the casement defining four interior surfaces. A flat layer of plastic and then a flat layer of metal is adhered to each of the interior surfaces. In this embodiment of the invention, a simpler and more rectangular shape is permitted for the enclosure. In the process of bending the single layer of steel, one does not have to consider the possible displacements of the three layers.

With either of the above described, a decorative surface may be easily applied to the surface of the metal since no priming or sanding is necessary as is necessary in the case of wood. Moreover, the decorative surface can be applied before bending of the casement and assemblage of the loudspeaker enclosure.

BRIEF DESCRIPTION OF THE DRAWINGS

FIG. 6 is a cross sectional side view of a loudspeaker enclosure with speakers, front panel, rear panel, partition, and a passive radiator;

FIG. 7 is a cross sectional view of a grooved molding for the rear panel; and

FIG. 8 is a cross sectional view of a grooved molding for the partition.

DETAILED DESCRIPTION OF THE INVENTION

Figure 1:
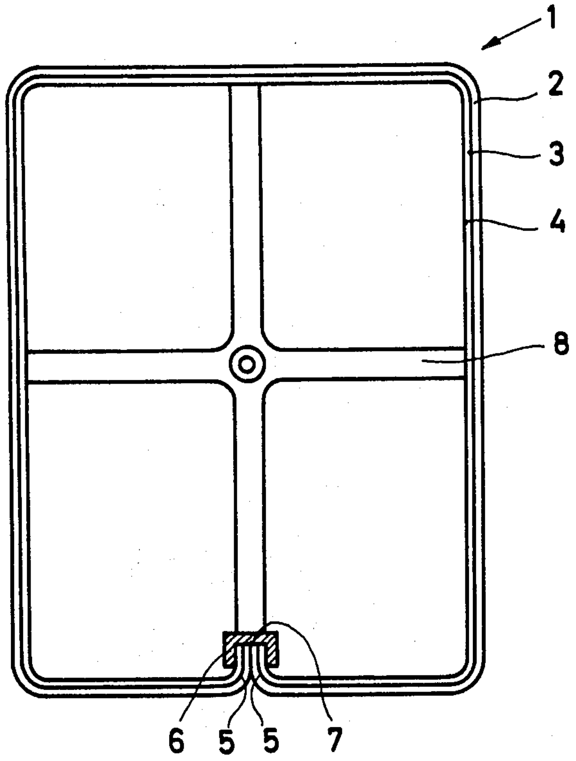
FIG. 1 is a front elevational view of a loudspeaker enclosure without the grill cloth and without the front panel.

FIG. 1 shows casement part 1 which is part of a loudspeaker enclosure. The loudspeaker enclosure includes front and back panels and casement part 1. Casement part 1 is made in one piece which has been bent into the shape of a rectangular cuboid with an open front and an open back. Casement part 1 is made from three layers 2, 3, 4. Outer layer 2 is made of metal, the middle layer 3 is made of plastic and the innermost layer 4 is also made of metal. The outer and the inner layers 2 and 4 could, for instance, be made of sheet steel of a thickness of one millimeter, while the middle layer 3 could be a plastic layer of 0.3 millimeter thickness. Optionally, the outer layer 2 can be made from aluminum.

The ends 5 of the triple layer are bent inwardly and meet at the bottom of the casement part 1 where the ends are held together by clamp 6. Between the clamp 6 and the ends 5 of the triple layer, a sealing material 7 is applied, the sealing material being, for instance, be a piece of foil.

In order to increase the flexural strength of the walls of the loudspeaker casement part 1 even further, a cross shaped brace 8 can be installed, the brace 8 extending between two opposite side walls and extending between the top wall and clamp 6. Brace 8 is preferably made from an elastomer and the flexural strength of the walls and the damping of this enclosure is increased. However, it should be understood that brace 8 is an optional feature for most speakers.

Figure 2:
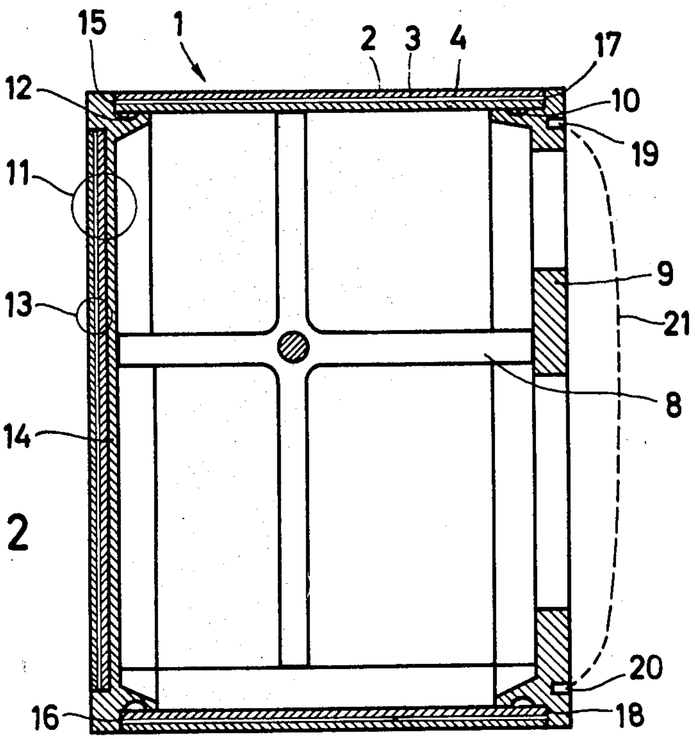
FIG. 2 is a cross sectional side view of a loudspeaker enclosure including the front and rear panels.

FIG. 2 shows a cross section of a loudspeaker enclosure which includes a front panel 9 and a back panel 11. The front panel or acoustic baffle 9 is preferably made of injected plastic foam and it is pressed into the casement part 1 with a sealing disk 10. The back panel 11 is also attached to the casement part 1 with a sealing disk 12.

The triple layer 13 of the back panel 11 forms the actual mechanical enclosure, while the thin plastic film 14 insures that the enclosure is sealed. The back edges 15 and 16 as well as the front edges 17 and 18 of the casement part 1 are covered by the back panel 11 or the acoustic baffle 9, so that these edges need not be finished. The acoustic baffle 9 includes notches 19 and 20 at the front which receive a grill cloth (indicated by a broken line in the drawing).

Figure 3:
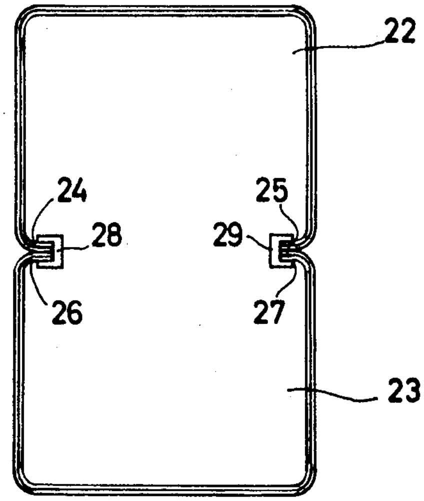
FIG. 3 is a front elevational view of a loudspeaker enclosure without the grill cloth and without the front panel.

FIG. 3 depicts a variation of the casement part 1 of FIG. 1. This variation consists of two equal parts 22 and 23 which are bent into a U-shape and whose ends 24, 25, 26 and 27 are bent inwardly. These ends are in contact and are held together by clamps 28 and 29. This kind of structure lends an increased stability and rigidity to the side panels of the enclosure.

Figure 4:
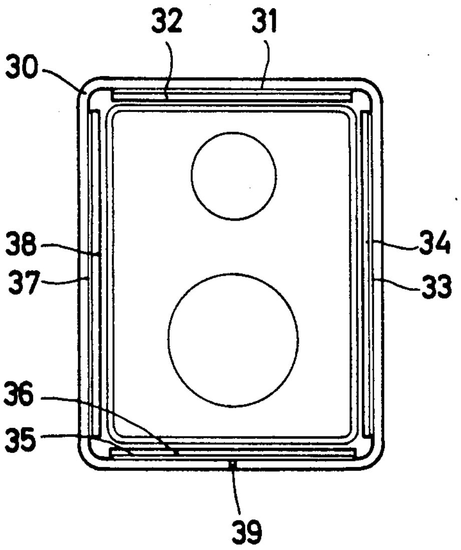
FIG. 4 is a front elevational view of a loudspeaker enclosure.

FIG. 4 shows a front elevational view of a casement part. However, this casement does not contain a triple layer. Rather, a single layer of steel 30 is used to form the rectangular enclosure. A single layer of steel 30 permits a simpler and more rectangular shape since bending of a single layer of metal does not require consideration of a possible displacement of three layers. In order to obtain the same favorable qualities in the enclosure shown in FIG. 4 as in an enclosure with a triple layer, a damping plastic layer 31, 33, 35, 37 and a metal layer 32, 34, 36, 38 are attached to the inner side of the single layer of steel 30.

The metal layer 36 covers the gap 39 of the outer metal layer 30 and thus becomes the mechanical connection between the ends of this layer. Since the layers 31–38 are flat, the inner sides of the corners of the outer layer of steel are not covered by these layers; that is, the inner sides of the corners of the enclosure only have one layer. Since only oscillation nodes appear in these corners, a damping material in the corners is unnecessary. Layer 38, which is only seen from the side in FIG. 4 is shown from the front in FIG. 5.

It would be efficient to process the surface layer of steel 30 before it is bent. For example, layer 30 could be either lacquered or laminated. Such a procedure is much more cost efficient than the finishing of a three dimensional unit.

Figure 5:
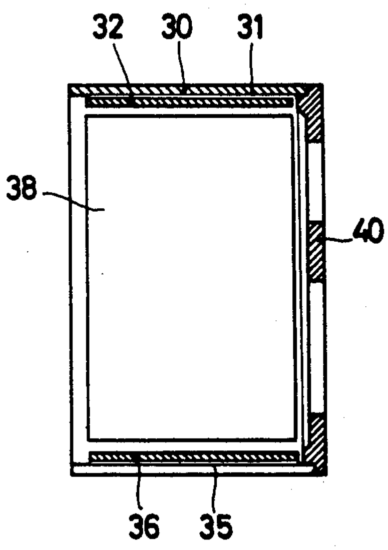
FIG. 5 is a cross sectional side view of a loudspeaker enclosure with front and rear panels.

FIG. 5 represents the cross section of a side view of a loudspeaker enclosure which corresponds to that of FIG. 4. However, an acoustic baffle 40 has been added. One can see that the inner layers 32 and 36 are set back from the front panel of the speaker enclosure far enough, so that the acoustic baffle 40 can be inserted into the casement which is formed by the outer layer 30. Layers 32 and 36 are likewise set back from the outer edge. Thus a simple seal is created.

FIG. 6 shows the cross section of a side view of a speaker enclosure. Aside from actively radiating loudspeakers, this enclosure also shows one passively radiating loudspeaker. The basic element of the speaker enclosure is again a steel casement 41. Steel plates 42, 43, 44 and plastic damping liners 45 and 46 have been glued to casement 41. A woofer 48 and a tweeter 49 have been fitted into acoustic baffle 47. The speakers are covered by a grill cloth 50 which is indicated by the broken line. The back panel 51 of the loudspeaker enclosure is formed by a triple layer of metal, plastic, and metal, and has been described previously.

Between the back panel 51 and the acoustic baffle 47 is a partition panel 52, which also contains three layers as described above. This panel 52 holds a passive radiator 53 and a crossover network which are instrumental in improving the acoustical properties of the loudspeaker system. The back panel 51 as well as the partition 52 are connected to the steel casement 41 by way of grooved moldings 55 and 56 which are preferably made of rubber. In case there happen to be spaces between the molding 56 of the partition 52 and the steel plate 44, or spaces 57 and 58 between the acoustic baffle 47 and the steel plate 44, the spaces can be sealed with an adhesive or a similar substance.

Openings 59 and 60 are located in the wall of the casement 41 between the back panel 51 and the partition 52. An additional layer of plastic and metal need not be adhered to portion 61 of steel casement 41.

FIG. 7 shows a cross sectional view of the grooved molding 55 for sealing and attaching back panel 51. This molding 55 has a U-shaped notch 62 for the insertion of the back panel 51. The molding 55 extends around the perifery the back panel 51. The lower edge of molding 55 is flexible. Before the back panel is inserted, the lower edge of molding 55 is in the position shown by the solid outline. After the back panel has been inserted, the lower edge is in the position indicated by the broken line. On the side opposite the U-shaped notch of molding 55, there are grooves 64 which permit molding 55 to a self-lock with respect to casement 41.

During assembly, the grooved molding 55 is put around the back panel 51 and the back panel is slid into the steel casing 41. The self-locking grooves 64 assure that the back panel 51 stays in place, while the molding edge covers the sharp corners of the steel casement 41.

FIG. 8 shows the cross section of the grooved molding 56, which functions to hold partition 52 in place. This molding 56 does not need a part corresponding to the molding edge in FIG. 7, since it does not have to cover any sharp corners. However, it will have a U-shaped notch 67 and grooves 65 and 66. The partition 52 is fitted into the U-shaped notch 67 before assembly and then the combination of partition 52 and molding 56 is inserted into the casement 41. The grooves 65 and 66 are slightly bent during this process and thus produce a force which pushes against the inner wall of the casement 41 which insures that the partition 52 is secured in the loudspeaker enclosure.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A loudspeaker enclosure comprising:

a casement, said casement defining the internal volume of the loudspeaker enclosure, said casement having openings at oppositely disposed front and rear sides thereof, the remaining sides of said casement being of multi-layer construction and including a first, a second and a third layer, said first, second and third layers forming a multi-layer sheet, said first and second layers being comprised of sheet metal, said third layer being comprised of plastic, said third layer being disposed between said first and second layers, said multi-layer sheet having been formed into a generally rectangular cuboid shape, said multi-layer sheet further being bent inwardly toward the center of said casement and terminating in a pair of securement ends, the securement ends being aligned in face to face relation, said casement further including means for locking said securement ends;

front panel means for sealing said casement front opening; and rear panel means for sealing said casement rear opening.

2. An enclosure according to claim 1 wherein the first and the second layers have the same thickness.

3. An enclosure according to claim 1 wherein the first layer and the second layer comprise steel.

4. An enclosure according to claim 1 wherein the first layer of the casement comprises steel and the second layer of the casement comprises aluminum, and the first layer is disposed on the interior of the enclosure and the second layer is disposed on the exterior of the enclosure.

5. An enclosure according to claim 1 wherein said locking means comprises a generally U-shaped clamp having a floor and two outer walls, said securement ends being positioned between said outer walls of said locking means, the two outer walls adapted to press the said securement ends together.

6. An enclosure according to claim 5 wherein sealing means is positioned between the floor of the U-shaped clamp and the securement ends.

7. An enclosure according to claim 6 and further including a brace comprising two supports which extend in generally perpendicular relation, the ends of one support bracing the casement, the ends of the second support bracing the casement and the U-shaped clamp.

8. An enclosure according to claim 7 wherein the casement comprises two casement parts, the casement parts being generally U-shaped and having securement ends which depend inwardly toward the center of the casement, the securement ends of one casement part being aligned and in face to face relation with the securement ends of the second casement part, and further including means for locking said securement ends.

9. An enclosure according to claim 8 wherein said means comprises two generally U-shaped clamps.

10. An enclosure according to claim 9 wherein sealing means is positioned between the floor of the U-shaped clamp and the securement ends.

11. An enclosure according to claim 9 and further including a brace comprising two supports which extend in generally perpendicular relation, the ends of one support bracing the casement, the ends of the second support bracing the two U-shaped clamps.

12. A loudspeaker enclosure comprising:

a casement, said casement defining the internal volume of the loudspeaker enclosure, said casement having openings at oppositely disposed front and rear sides thereof, the remaining sides of said casement being of multi-layer construction and including a first, a second and a third layer, said first and second layers being comprised of sheet metal, said third layer being comprised of plastic, said third layer being disposed between said first and second layers, said casement further defining a front edge and a rear edge;

front panel means for sealing said casement front opening, said front panel means including on the edge thereof a detent having a first portion and a second portion, said detent first portion engaging the interior surface of said casement and said detent second portion engaging the front edge of said casement; and rear panel means for sealing said casement rear opening, said rear panel means including a detent on the edge thereof, said rear panel means detent having a first portion and a second portion, said detent first portion engaging the interior surface of said casement and said detent second portion engaging the rear edge if said casement.

13. An enclosure according to claim 12 wherein the layers of said multilayer construction are not coextensive and wherein the first layer of said casement is bent to a generally rectangular cuboid shape which defines said casement and said second and third layers comprise flat sheets which are adhered to the inwardly facing surfaces of the rectangular casement.

14. An enclosure according to claim 12 wherein said rear panel means comprises three layers which are mounted to a plastic sheet.

15. An enclosure according to claim 14 wherein said rear panel means includes a layer of plastic between two layers of metal.

16. An enclosure according to claim 13 wherein said first and said second layers are spaced from the front and the rear edge of the casement.

17. An enclosure according to claim 16 and further including a partition which is installed between the front panel means and the rear panel means, said partition being adapted to hold a passive acoustic radiator.

18. An enclosure according to claim 17 wherein the partition includes a molding having a groove adapted to receive the partition, said partition and said molding capable of being slid into said casement to engage said first layer of said casement.

19. An enclosure according to claim 18 wherein the first, second and third layers of the casement extend between the front panel means and the partition and wherein the casement consists essentially of the first layer between the partition and the rear panel means.

20. An enclosure according to claim 19 wherein the casement between the rear panel means and the partition includes at least one port.

21. An enclosure according to claim 20 wherein the rear panel means includes a grooved molding having a deformable edge and a groove for engaging the back panel, said edge engaging and covering the rear edge of the casement.

22. An enclosure according to claim 18 wherein the grooved molding of the partition and the grooved molding of the rear panel include a plurality of self locking ridges, said ridges adapted to deform and engage the casement.

* * * * *